(12) United States Patent
Lee et al.

(10) Patent No.: US 7,385,274 B2
(45) Date of Patent: Jun. 10, 2008

(54) HIGH-VOLTAGE METAL-OXIDE-SEMICONDUCTOR DEVICES AND METHOD OF MAKING THE SAME

(75) Inventors: Wen-Fang Lee, Hsin-Chu (TW); Wei-Lun Hsu, Hsin-Chu Hsien (TW); Yu-Hsien Lin, Kao-Hsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 113 days.

(21) Appl. No.: 11/381,749

(22) Filed: May 5, 2006

(65) Prior Publication Data

US 2006/0270134 A1  Nov. 30, 2006

Related U.S. Application Data

(63) Continuation of application No. 10/908,811, filed on May 26, 2005, now Pat. No. 7,067,365.

(51) Int. Cl.
*H01L 29/93* (2006.01)

(52) U.S. Cl. .................................... 257/501; 257/500
(58) Field of Classification Search ................. 257/68, 257/E27.084, 500, 501
See application file for complete search history.

(56) References Cited

U.S. PATENT DOCUMENTS

| 6,740,939 B2 | 5/2004 | Sayama | |
|---|---|---|---|
| 7,250,346 B2 * | 7/2007 | Chun et al. | 438/283 |
| 2002/0125512 A1 | 9/2002 | Hino | |
| 2005/0158964 A1 * | 7/2005 | Chiu et al. | 438/424 |
| 2006/0113627 A1 * | 6/2006 | Chen et al. | 257/500 |

FOREIGN PATENT DOCUMENTS

TW    448573    8/2001

* cited by examiner

*Primary Examiner*—Douglas M Menz
(74) *Attorney, Agent, or Firm*—Winston Hsu

(57) ABSTRACT

An improved high-voltage process is disclosed. In order to improve the performance in terms of breakdown voltage and to maintain the integrity of the STI structures, the thick gate oxide layer of the high-voltage device area is not etched back before a high-dosage ion doping process. One photo mask is therefore omitted.

12 Claims, 14 Drawing Sheets

HIGH-VOLTAGE METAL-OXIDE-SEMICONDUCTOR DEVICES AND METHOD OF MAKING THE SAME

CROSS REFERENCE TO RELATED APPLICATIONS

This is a continuation application of U.S. patent application Ser. No. 10/908,811 filed May 26, 2005.

BACKGROUND OF THE INVENTION

1. Field of the Invention

The present invention relates generally to the field of semiconductor fabrication and, more particularly, to a method of fabricating high-voltage metal-oxide-semiconductor (MOS) devices.

2. Description of the Prior Art

Integrated circuits (ICs) containing both high-voltage and low-voltage devices such as high/low voltage MOS transistor devices are known in the art. For example, the low-voltage device may be used in the control circuits as the high-voltage device may be used in electrically programmable read only memory (EPROM) or the driving circuits of the liquid crystal display devices.

Please refer to FIG. 1 to FIG. 7. FIGS. 1 to 7 are schematic, cross-sectional diagrams illustrating a method of fabricating a high-voltage NMOS device in accordance with the prior art. As shown in FIG. 1, a semiconductor substrate 10 is provided. The high-voltage NMOS device is formed within the high-voltage P well (HVPW) 12. Shallow trench isolation (STI) structures 14 and 16 are formed in the semiconductor substrate 10. The STI structure 14 defines a high-voltage device area 102, which is further divided into two sub-areas 104 and 106 by STI structure 16.

As shown in FIG. 2, an ion implantation process is carried out to form an N grade diffusion region 20 within the HVPW 12. Subsequently, a pad oxide layer 22 and a pad nitride layer 24 are formed on the surface of the semiconductor substrate 10.

As shown in FIG. 3, the entire high-voltage device area 102 is exposed by selectively etching away the pad oxide layer 22 and the pad nitride layer 24 within the high-voltage device area 102. As shown in FIG. 4, a thick oxide layer 42 (about 850 angstroms for 32V or 42V device) is grown on the exposed semiconductor substrate 10 including sub-areas 104 and 106.

As shown in FIG. 5, a polysilicon gate 52 is patterned on the thick oxide layer 42 of the sub-area 104. The polysilicon gate 52 laterally extends to the STI structure 16.

According to the prior art, a photo-mask is then employed to define a photoresist layer (not shown) over the semiconductor substrate 10. The photoresist layer is used to protect the semiconductor substrate 10 except the high-voltage device area 102. Using the photoresist layer and the polysilicon gate as a hard mask, a dry etching process is performed to etch the thick oxide layer 42.

As shown in FIG. 6, when removing the thick oxide layer 42 within the high-voltage device area 102, which is not covered by the polysilicon gate 52, recessed areas 64 and 66 with hundreds of angstroms are simultaneously formed in the STI structures 14 and 16, respectively.

As shown in FIG. 7, an N+ doping process is carried out to form, within the sub-area 104, an N+ region 72 next to the polysilicon gate 52, and to form, within the sub-area 106, an N+ region 74. The aforementioned recessed areas 64 and 66 adversely affect the doping profile of the N+ regions 72 and 74 as well as the performance of the high-voltage device. As specifically indicated in FIG. 7, through the recessed areas 64 and 66, the N+ doping process also creates downwardly extended tails 72a and 74a. As a result, the N+ region 74 is close to the junction 78 between the HVPW 12 and the N grade diffusion region 20, and the breakdown voltage of the high-voltage device is therefore decreased.

In light of the above, there is a need in this industry to provide an improved method for fabricating high-voltage MOS devices.

SUMMARY OF THE INVENTION

It is therefore a primary object of the present invention to provide a method of fabricating high-voltage metal-oxide-semiconductor (MOS) devices, which is capable of solving the aforementioned problems.

Another object of the present invention is to provide a method of fabricating high-voltage MOS devices, which is compatible with low-voltage process.

According to the claimed invention, a method of fabricating a high-voltage metal-oxide-semiconductor (MOS) device includes the steps of:

(1) providing a semiconductor substrate comprising a high-voltage device area thereon and shallow trench isolation (STI) structure that further divides the high-voltage device area into a first sub-area and a second sub-area;

(2) implanting ions into the semiconductor substrate within the high-voltage device area to form a first doping region and a second doping region with a channel region defined therebetween;

(3) forming a pad oxide layer on the semiconductor substrate;

(4) depositing a pad nitride layer on the pad oxide layer;

(5) forming an opening in the pad nitride layer and the pad oxide layer, wherein the opening merely exposes a portion of the first sub-area of the high-voltage device area including the channel region;

(6) growing a first oxide layer on exposed the semiconductor substrate via the opening;

(7) stripping off remaining the pad nitride layer and the pad oxide layer;

(8) growing a second oxide layer on the first sub-area and on the second sub-area;

(9) forming a gate on the first oxide layer; and

(10) performing an ion implantation process, using the gate and the first oxide layer as an implant mask, to form a third doping region within the first doping region and a fourth doping region within the second doping region.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to a high-voltage semiconductor process that is compatible with low-voltage process. One preferred embodiment of the present invention will be explained in detail with reference to FIGS. 8 to 14, wherein like elements, regions or layers are designated with like numerals. It is to be understood that the present invention is suited for NMOS, PMOS, and CMOS processes, although only exemplary NMOS process steps are demonstrated.

Figure 1:
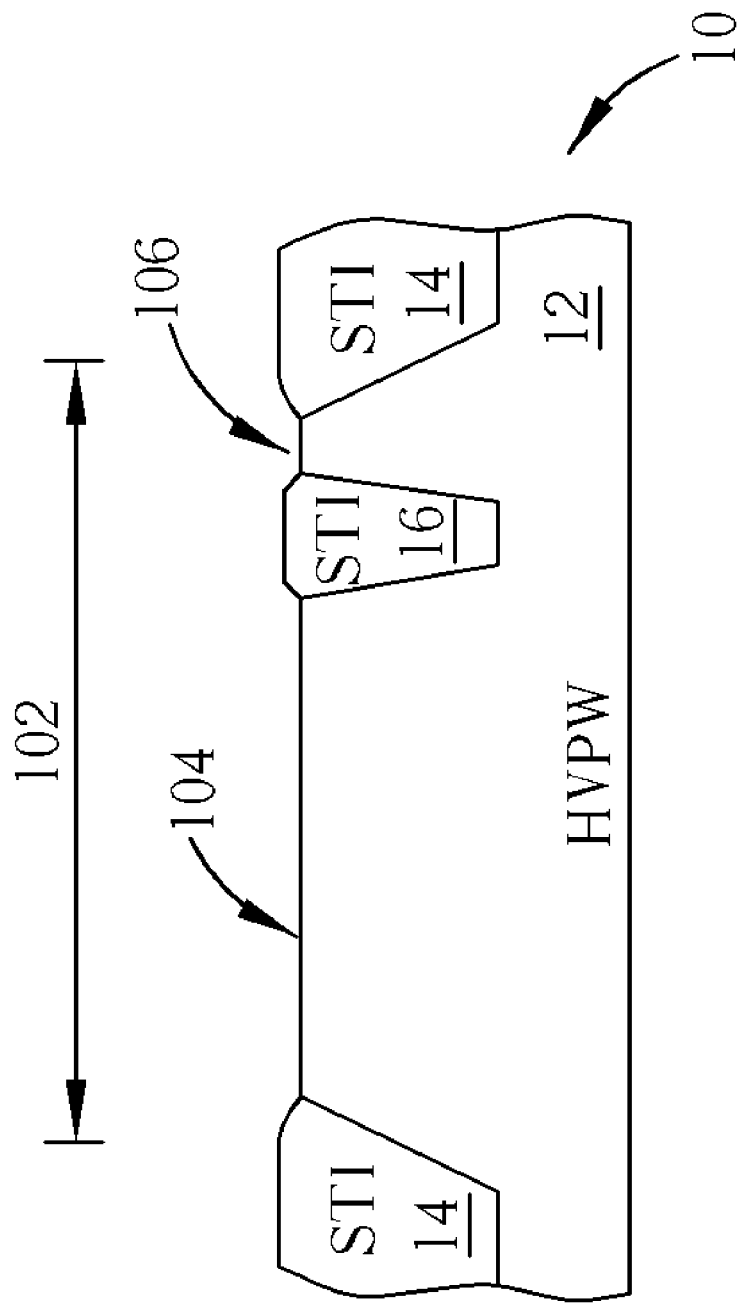
FIGS. 1 to 7 are schematic, cross-sectional diagrams illustrating a method of fabricating a high-voltage MOS device in accordance with the prior art.
Figure 2:
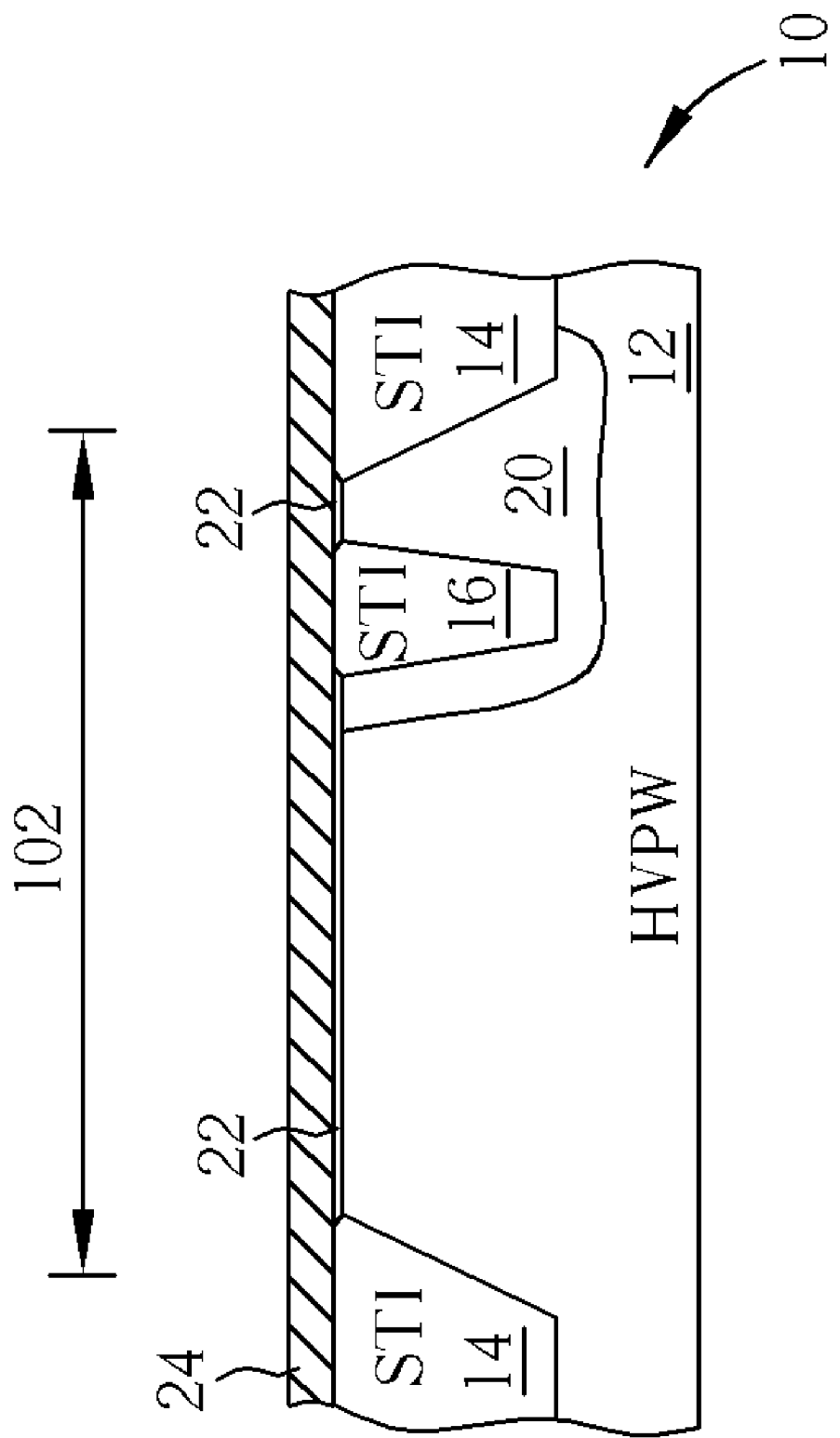
Figure 3:
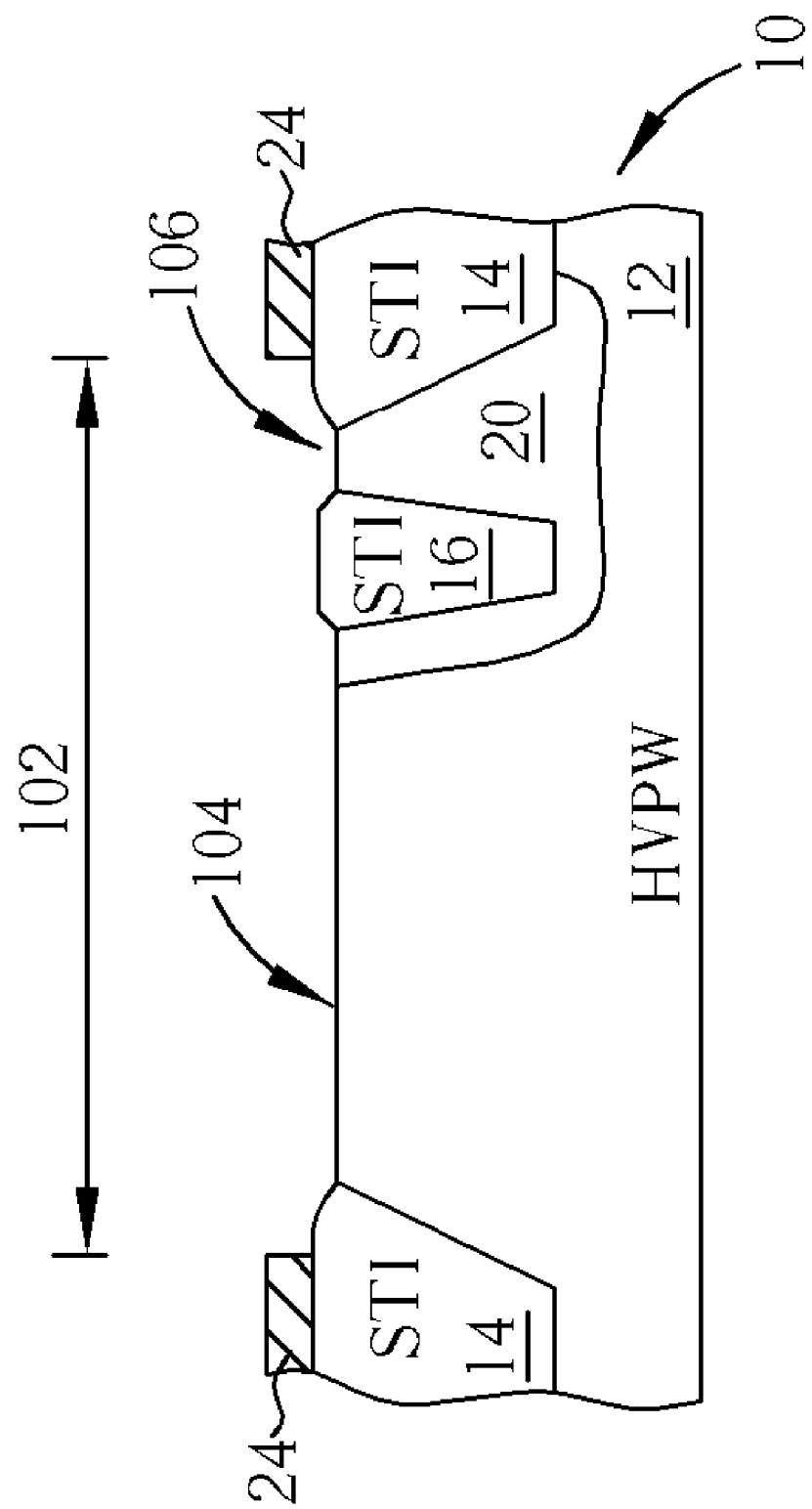
Figure 4:
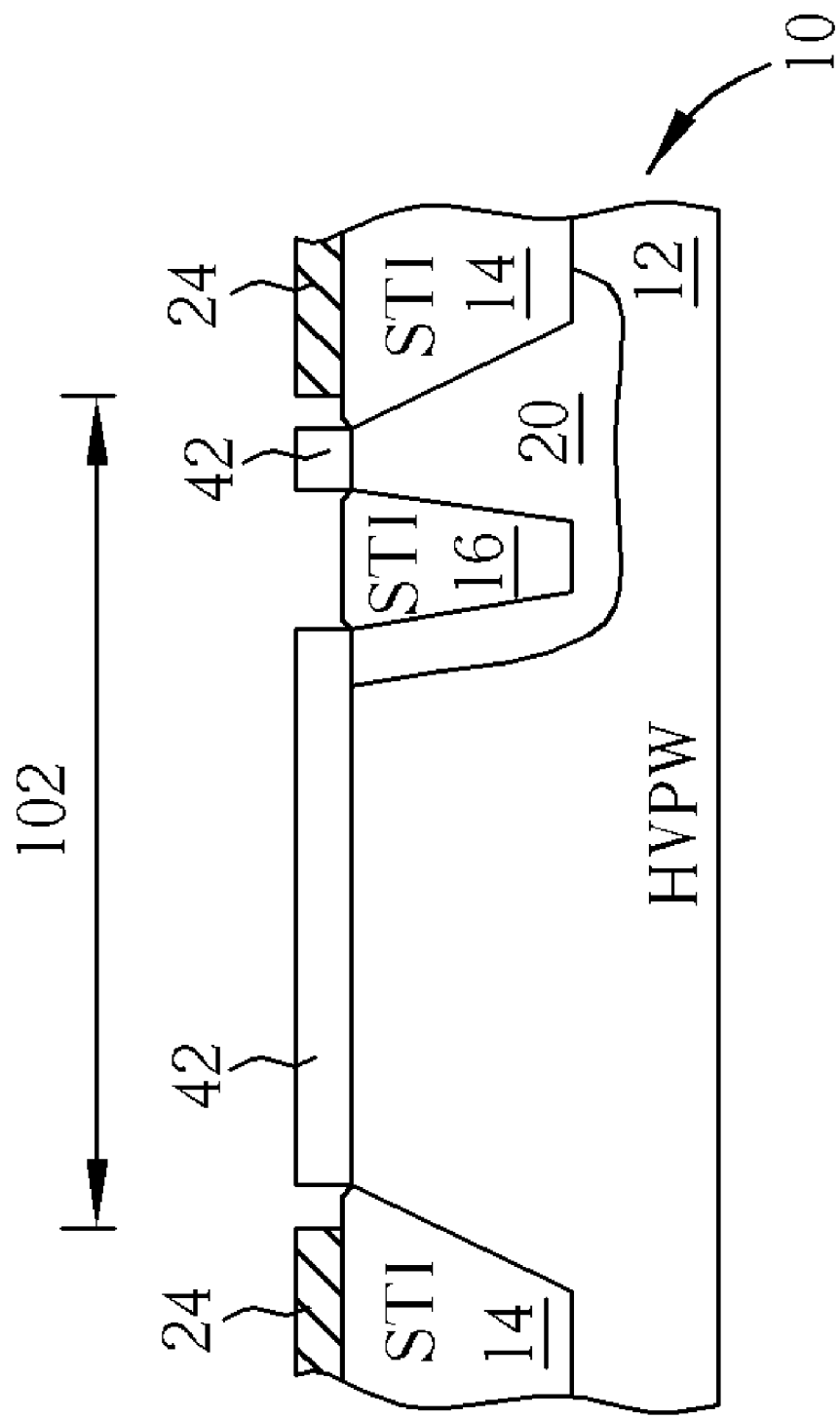
Figure 5:
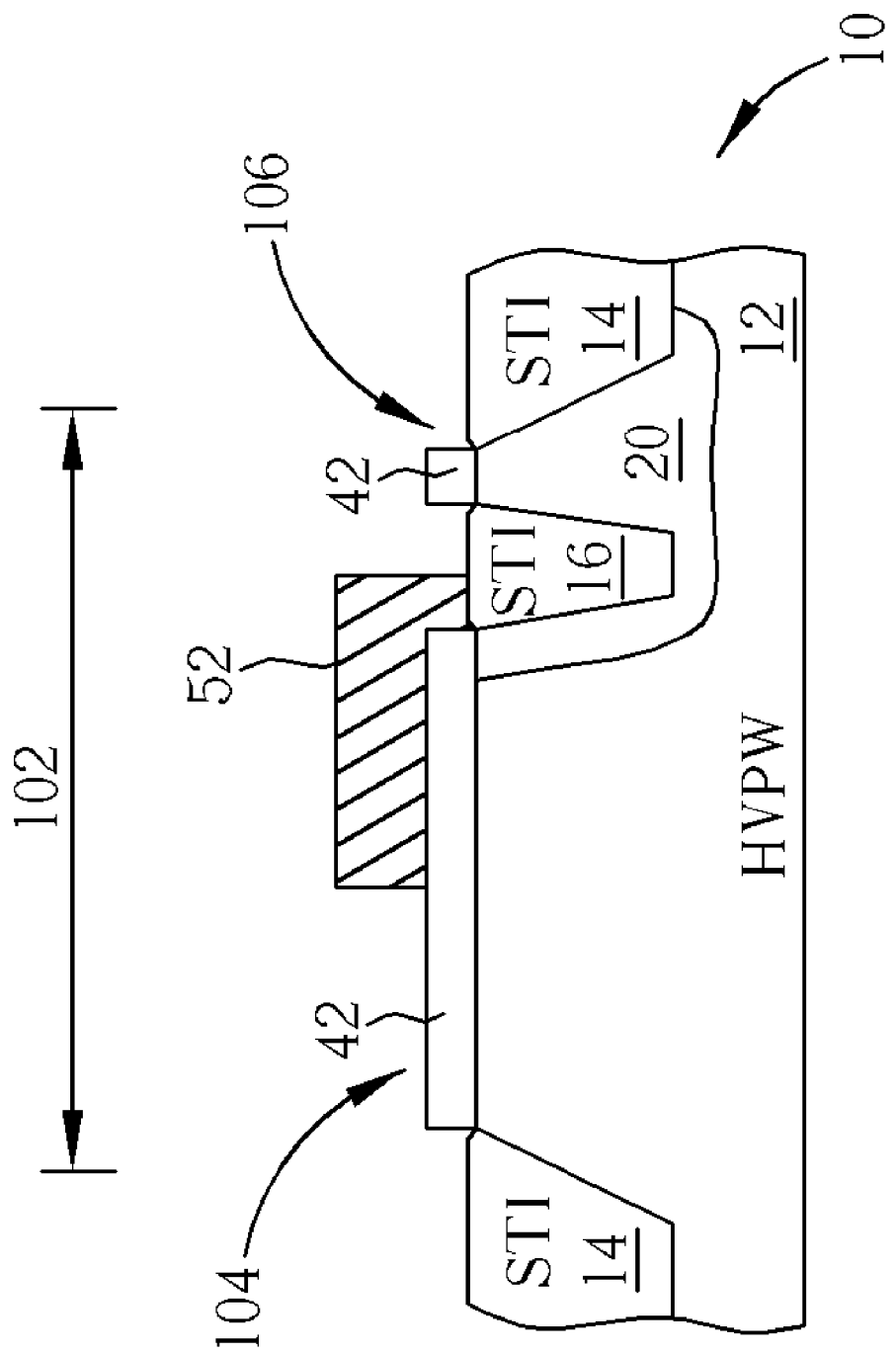
Figure 6:
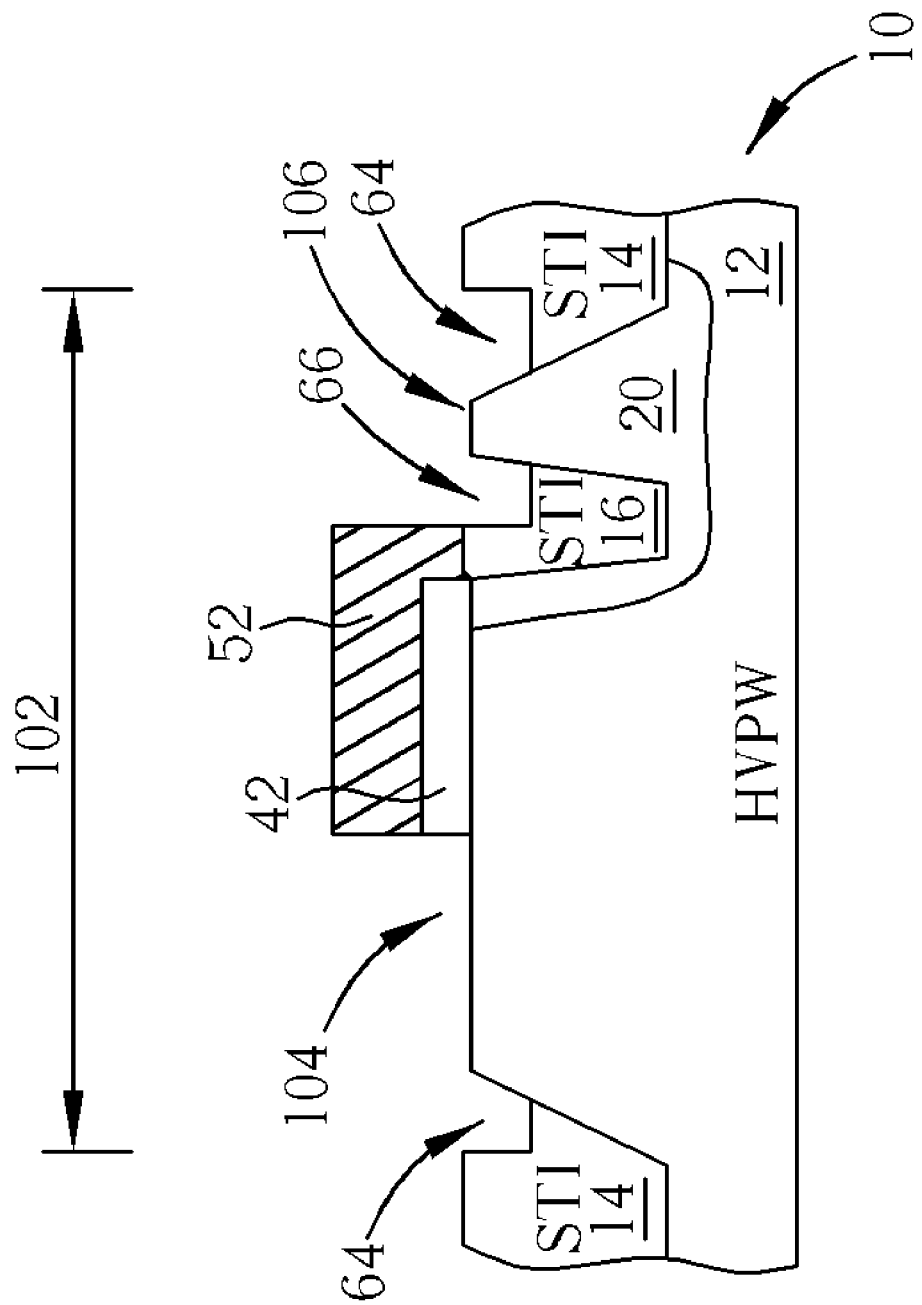
Figure 7:
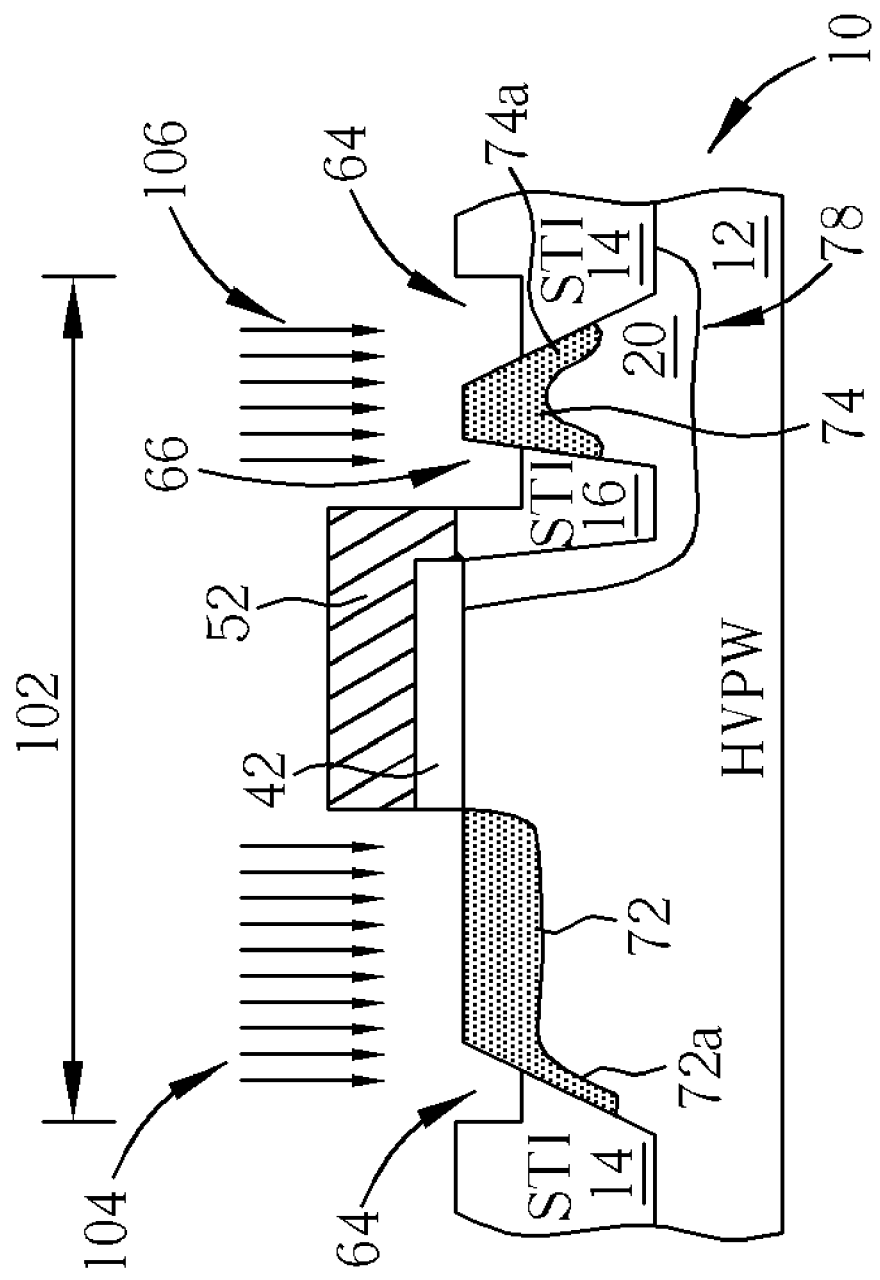
Figure 8:
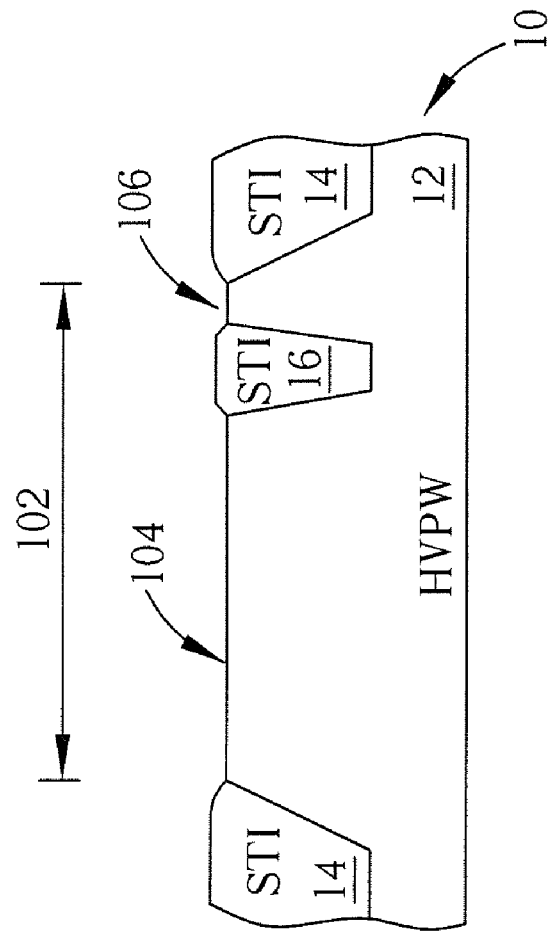
FIGS. 8 to 14 are schematic, cross-sectional diagrams illustrating a method of fabricating a high-voltage MOS device in accordance with one preferred embodiment of the present invention.
Figure 8:
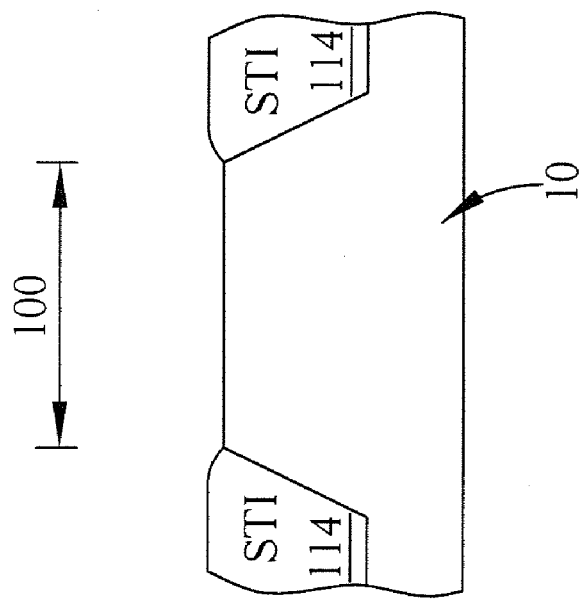

Please refer to FIGS. 8 to 14. FIGS. 8 to 14 are schematic, cross-sectional diagrams illustrating a method of fabricating a high-voltage NMOS device in accordance with one preferred embodiment of the present invention. As shown in FIG. 8, a semiconductor substrate 10 is provided. The high-voltage NMOS device is formed within the high-voltage P well (HVPW) 12 of the semiconductor substrate 10. Shallow trench isolation (STI) structures 114, 14 and 16 are formed in the semiconductor substrate 10. The STI structure 114 is used to define a low-voltage device area 100. The STI structure 14 is used to define a high-voltage device area 102, which is further divided into two sub-areas 104 and 106 by STI structure 16. A low-voltage device is to be formed within the low-voltage device area 100. A high-voltage device is to be formed within the high-voltage device area 102. A channel region and one source/drain region of the high-voltage device will be formed within the sub-area 104, while the other source/drain region of the high-voltage device will be formed within the sub-area 106.

Figure 9:
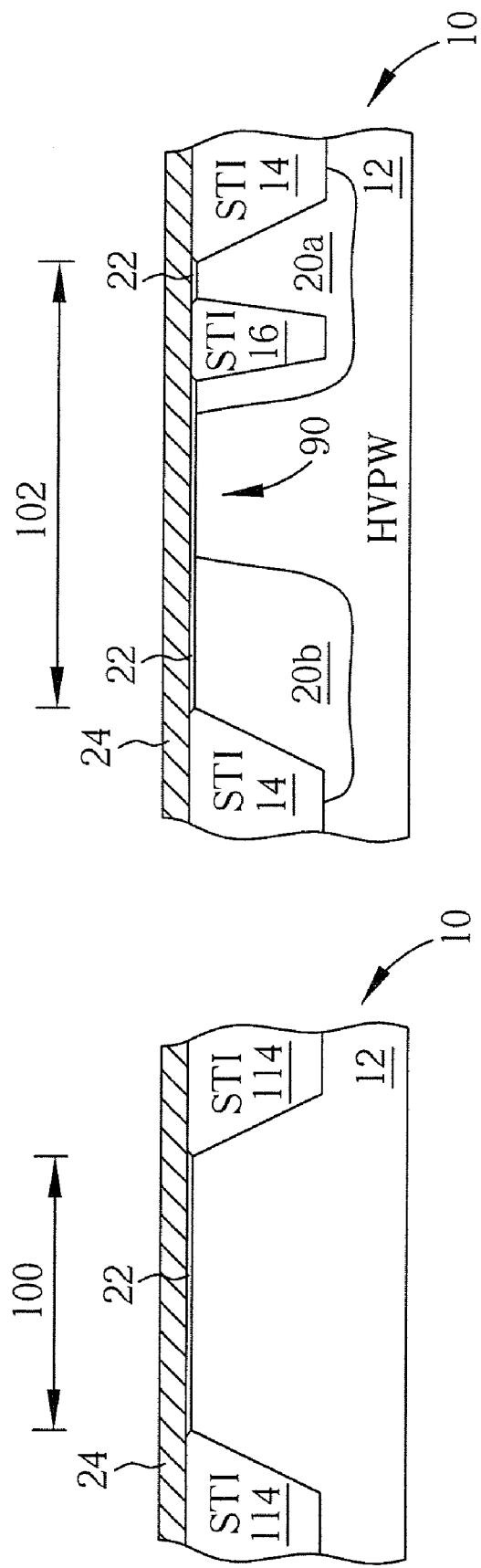

As shown in FIG. 9, an ion implantation process is carried out to form spaced-apart N grade diffusion regions 20a and 20b within the HVPW 12. Between the N grade diffusion region 20a and N grade diffusion region 20b is channel region 90. The N grade diffusion region 20a borders the STI structure 16 and extends to the sub-area 104. Subsequently, a pad oxide layer 22 and a pad nitride layer 24 are formed on the surface of the semiconductor substrate 10.

Figure 10:
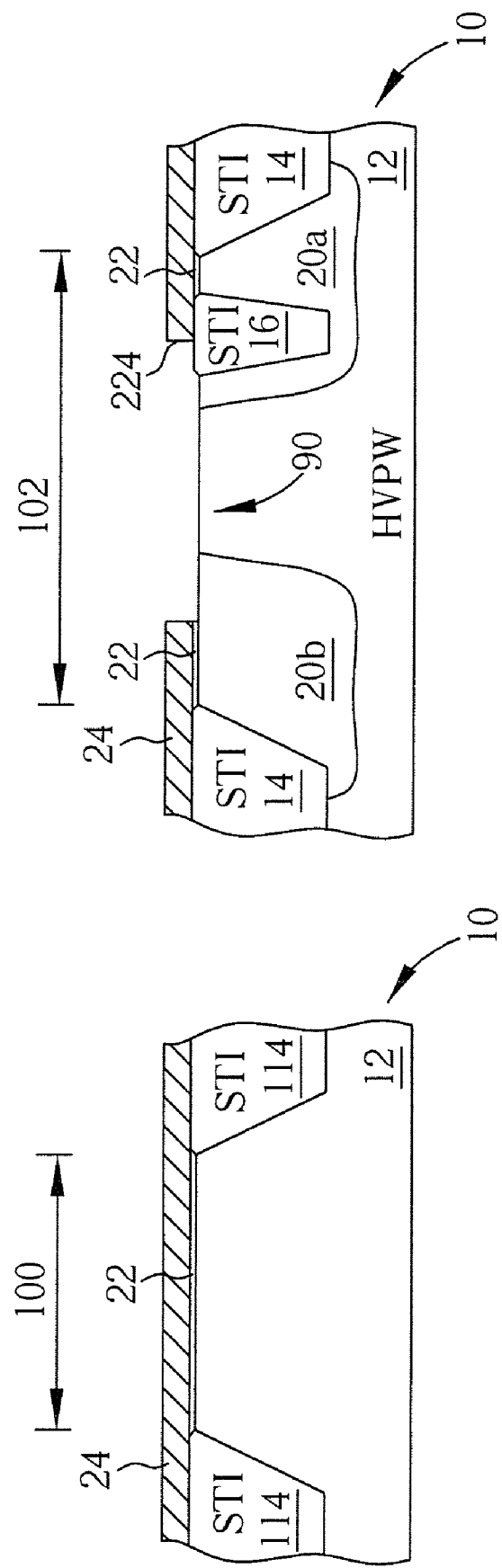

As shown in FIG. 10, a lithographic and etching process is performed to form an opening 224 in the pad oxide layer 22 and pad nitride layer 24, which merely exposes the channel region 90 and a portion of the N grade diffusion region 20b within the high-voltage device area 102. At this phase, the sub-area 106 of the high-voltage device area 102 and the entire low-voltage device area 100 are still covered by the pad nitride layer 24.

Figure 11:
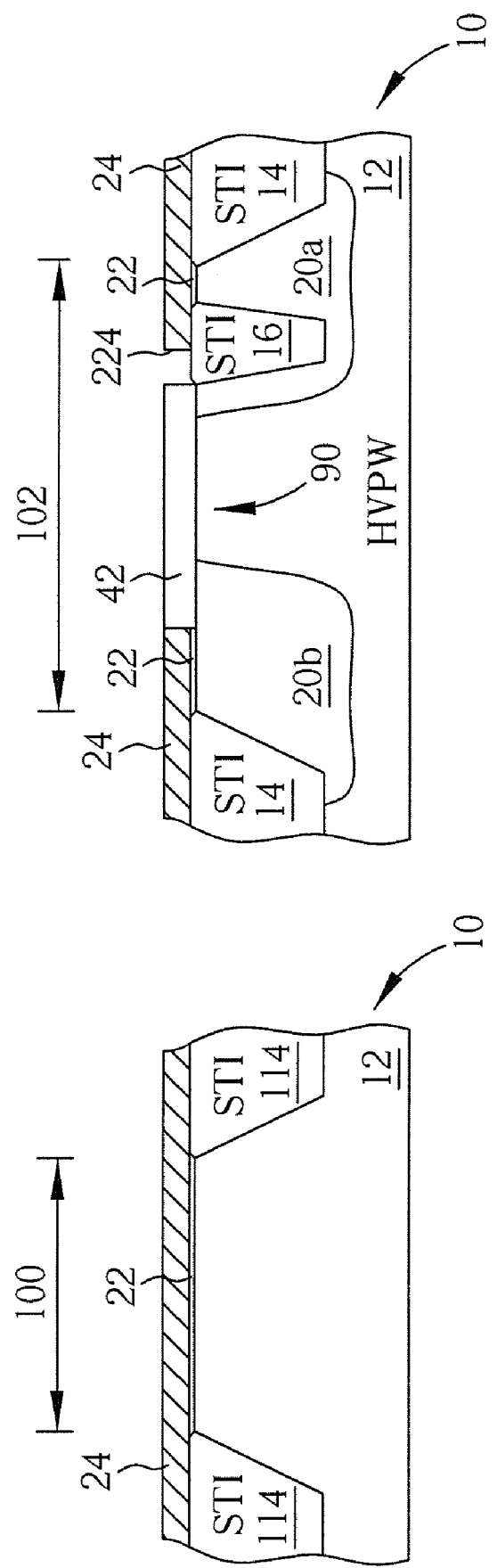

As shown in FIG. 11, a thermal process is performed. A thick gate oxide layer 42 is grown on the exposed semiconductor substrate 10 via the opening 224. The thickness of the thick gate oxide layer 42 may be between 700 and 900 angstroms, for example, 850 angstroms. The thick gate oxide layer 42 covers the channel region 90 and a portion of the N grade diffusion region 20b that is adjacent to the channel region 90.

Figure 12:
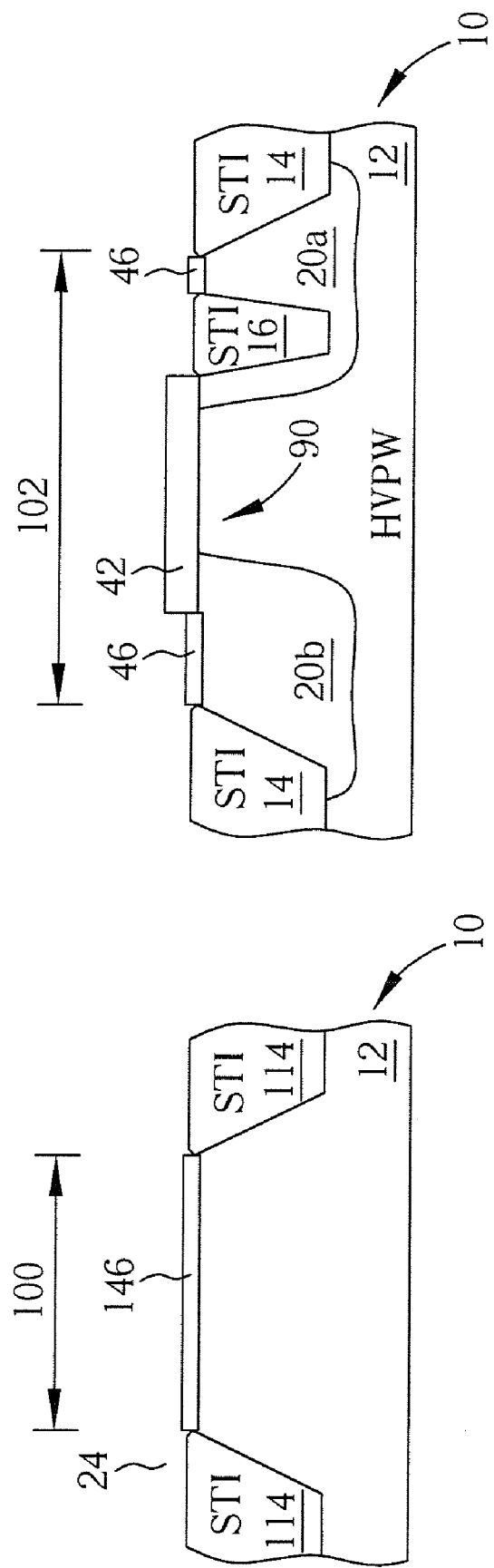

As shown in FIG. 12, the remaining pad oxide layer 22 and pad nitride layer 24 are stripped off to expose the sub-area 106, the low-voltage device area 100, and the rest of the N grade diffusion region 20b within the sub-area 104. Thereafter, another thermal process is carried out to grow a thin gate oxide layer 146 within the low-voltage device area 100 and a thin gate oxide layer 46 within the high-voltage device area 102.

Figure 13:
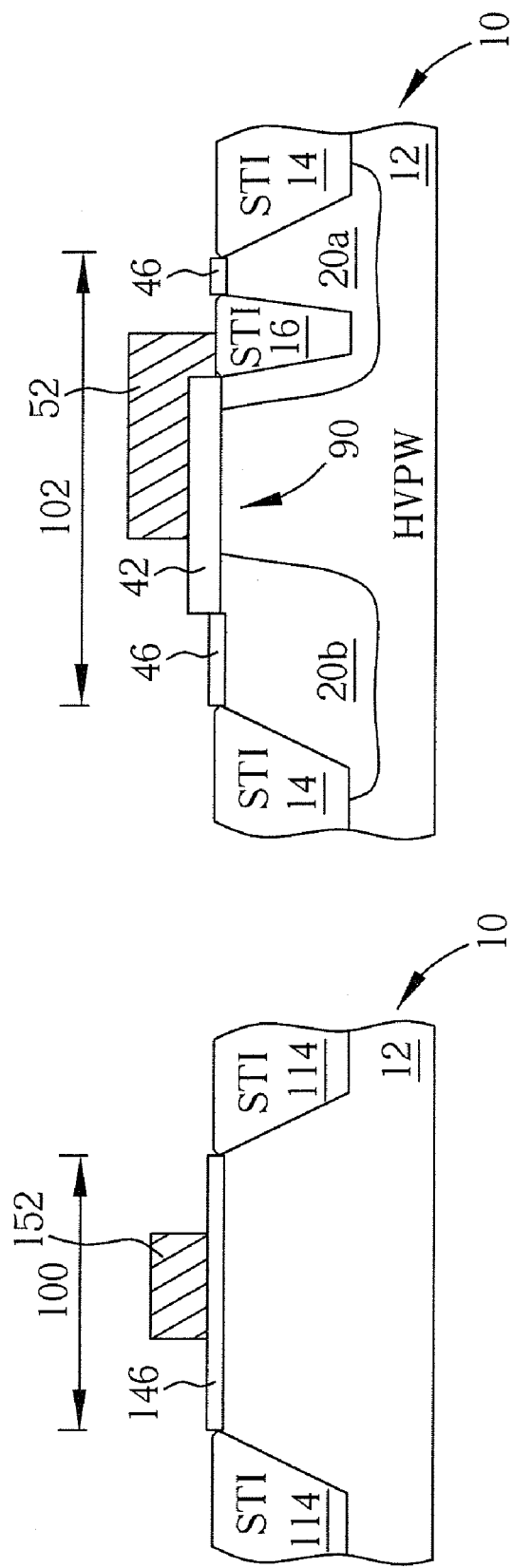

As shown in FIG. 13, a polysilicon gate 52 is patterned on the thick gate oxide layer 42 of the sub-area 104. The polysilicon gate 52 laterally extends to the STI structure 16. Simultaneously, a polysilicon gate 1 52 is patterned on the thin gate oxide layer 146.

Figure 14:
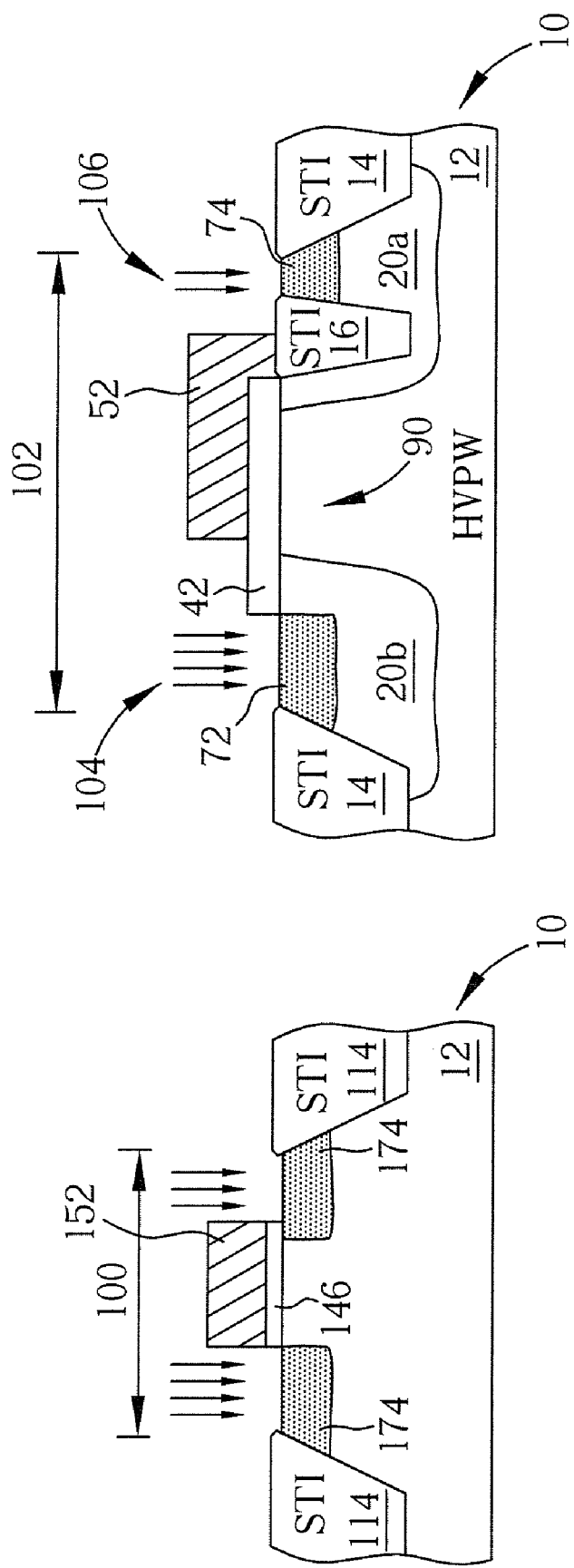

Finally, as shown in FIG. 14, using the polysilicon gate 52 and the thick gate oxide layer 42 as an implant mask, an N+ doping process is then carried out to form, within the sub-area 104, an N+ region 72 next to the thick gate oxide layer 42, and to form, within the sub-area 106, an N+ region 74. Simultaneously, N+ regions 174 are formed in the low-voltage device area 100.

The present invention at least comprises the following advantages over the prior art method. First, according to this invention, there is no need to etch back the thick gate oxide layer 42 before the N+doping process. The present invention method avoids the formation of recessed areas in the STI structures, which, as stated supra, adversely affect the performance of the high-voltage device in terms of breakdown voltage. Secondly, the present invention method is more cost-effective since one photo mask (for etching the thick gate oxide layer) is omitted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage metal-oxide-semiconductor device, comprising:
   a semiconductor substrate of first conductivity type comprising a high-voltage device area thereon and shallow trench isolation (STI) structure that further divides said high-voltage device area into a first sub-area and a second sub-area;
   a first doping region of second conductivity type and a second doping region of second conductivity type doped in said semiconductor substrate within said high-voltage device area, a channel region being defined between said first doping region and said second doping region;
   a third doping region encompassed by said first doping region;
   a fourth doping region encompassed by said second doping region, wherein
   said fourth doping region is formed within said second sub-area;
   a gate electrode situated on the channel region; and
   a gate dielectric layer interposed between said gate electrode and said channel region, wherein said gate dielectric layer comprises an extended portion laterally protruding from bottom of said gate electrode and overlying a portion of said first doping region between said third doping region and said channel region and said gate dielectric layer is not completely aligned with said gate electrode,
   wherein a difference in height between a top surface of said STI structure and top surface of said semiconductor substrate is smaller than a thickness of said gate dielectric layer.

2. The high-voltage metal-oxide-semiconductor device according to claim 1 wherein the thickness of said gate dielectric layer is 700~900 angstroms.

3. The high-voltage metal-oxide-semiconductor device according to claim 1 wherein said gate electrode laterally extends to said STI structure.

4. The high-voltage metal-oxide-semiconductor device according to claim 1 wherein said first doping region has a doping concentration that is substantially equal to that of said second doping region.

5. The high-voltage metal-oxide-semiconductor device according to claim 1 wherein said third doping region has a doping concentration that is substantially equal to that of said fourth doping region.

6. The high-voltage metal-oxide-semiconductor device according to claim 1 wherein said third doping region has a doping concentration that is greater than that of said first doping region.

7. The high-voltage metal-oxide-semiconductor device according to claim 1 wherein said fourth doping region has a doping concentration that is greater than that of said second doping region.

8. The high-voltage metal-oxide-semiconductor device according to claim 1 wherein said second doping region borders said STI structure and extends to said first sub-area.

9. The high-voltage metal-oxide-semiconductor device according to claim 1 wherein said top surface of said STI structure is higher than said top surface of said semiconductor substrate.

10. The high-voltage metal-oxide-semiconductor device according to claim 1 wherein said top surface of said STI structure is substantially as high as said top surface of said semiconductor substrate.

11. The high-voltage metal-oxide-semiconductor device according to claim 1 wherein said top surface of said STI structure is lower than said top surface of said semiconductor substrate.

12. The high-voltage metal-oxide-semiconductor device according to claim 1 wherein said top surface of said STI structure is substantially planar.

* * * * *